US009337606B2

(12) United States Patent  (10) Patent No.: US 9,337,606 B2
Palese  (45) Date of Patent: May 10, 2016

(54) SPECTRAL-TEMPORAL MULTIPLEXER FOR PULSED FIBER SCALING

(71) Applicant: NORTHROP GRUMMAN SYSTEMS CORPORATION, Falls Church, VA (US)

(72) Inventor: Stephen P. Palese, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/681,766

(22) Filed: Apr. 8, 2015

(65) Prior Publication Data

US 2015/0303645 A1  Oct. 22, 2015

Related U.S. Application Data

(60) Provisional application No. 61/982,234, filed on Apr. 21, 2014.

(51) Int. Cl.
*H01S 3/067* (2006.01)
*G02B 3/00* (2006.01)
(Continued)

(52) U.S. Cl.
CPC .......... *H01S 3/06783* (2013.01); *G02B 3/0037* (2013.01); *G02B 5/0816* (2013.01); *G02B 27/10* (2013.01); *H01S 3/0057* (2013.01); *H01S 3/06758* (2013.01); *G02B 27/1006* (2013.01); *H01S 3/005* (2013.01); *H01S 5/12* (2013.01); *H01S 5/4012* (2013.01); *H01S 5/4087* (2013.01)

(58) Field of Classification Search
CPC ............ H01S 3/06783; H01S 3/06754; H01S 3/0057; G02B 27/1006
See application file for complete search history.

(56) References Cited

U.S. PATENT DOCUMENTS 5,793,907 A * 8/1998 Jalali .................... G02B 6/2861
385/24
6,522,436 B2  2/2003 Roberts et al.
(Continued)

FOREIGN PATENT DOCUMENTS

CN  102237633 A  11/2011

OTHER PUBLICATIONS

Fan, "Laser Laser Beam Combining for High-Power, High-Radiance Sources", IEEE Journal of Selected Topics in Quantum Electronics, vol. 11, No. 3, pp. 567-577, May/Jun. 2005.*

(Continued)

*Primary Examiner* — Eric Bolda
(74) *Attorney, Agent, or Firm* — John A. Miller; Miller IP Group, PLC

(57) ABSTRACT

A pulsed fiber laser amplifier system including a plurality of optical seed beam sources each generating a seed pulse beam at a different point in time and at a different wavelength than the other seed beam sources. The system further includes an optical coupler responsive to each of the seed pulse beams that outputs the pulse beams on a common optical path as a pulsed envelope beam. The system also includes a plurality of fiber amplifier stages responsive to the pulse envelope beam from the optical coupler that amplifies each pulse in the pulse envelope beam. The system further includes a spectral-temporal beam combiner that provides a separate delay for each of the amplified pulses in the pulse envelope beam so as to output a single output beam pulse that is in overlap of all of the individual amplified pulses in the pulse envelope beam.

19 Claims, 4 Drawing Sheets

(51) Int. Cl.
  *H01S 3/00* (2006.01)
  *G02B 27/10* (2006.01)
  *G02B 5/08* (2006.01)
  *H01S 5/12* (2006.01)
  *H01S 5/40* (2006.01)

(56) References Cited

U.S. PATENT DOCUMENTS

| | | |
|---|---|---|
| 6,570,704 B2 | 5/2003 | Palese |
| 7,573,918 B1 | 8/2009 | Soh et al. |
| 7,844,180 B2 | 11/2010 | Pincemin |
| 7,916,762 B2 | 3/2011 | Messerly et al. |
| 7,948,680 B2 | 5/2011 | Goodno |
| 8,107,167 B2 | 1/2012 | Galvanauskas et al. |
| 8,309,885 B2 | 11/2012 | Peng et al. |
| 8,441,718 B2 | 5/2013 | Mead |
| 8,531,761 B2 | 9/2013 | Chann et al. |
| 8,537,866 B2 | 9/2013 | Lin |
| 8,593,725 B2 | 11/2013 | Kliner et al. |
| 8,630,323 B2 | 1/2014 | Honea et al. |
| 8,665,918 B2 | 3/2014 | Creeden et al. |
| 2006/0257150 A1 | 11/2006 | Tsuchiya |
| 2009/0324170 A1 | 12/2009 | Cheung et al. |
| 2011/0122895 A1 | 5/2011 | Savage-Leuchs et al. |
| 2011/0280581 A1 | 11/2011 | Chann et al. |
| 2011/0305250 A1 | 12/2011 | Chann et al. |
| 2014/0050234 A1 | 2/2014 | Ter-Mikirtychev |
| 2014/0071520 A1 | 3/2014 | Armstrong |

OTHER PUBLICATIONS

Drachenberg, Derrek et al. "High Power Spectral Beam Combining of Fiber Lasers with Ultra High Spectral Density by Thermal Tuning of Volume Bragg Gratings" Fiber Lasers VIII: Technology, Systems, and Applications, Proc. of SPIE vol. 7914, 2011, pp. 7914F-1-7914F-10.

Kuo, Bill P.-P. et al. "Fast Wideband Source Tuning by Extra-Cavity Parametric Process" OPTICS Express, vol. 18, No. 19, Sep. 13, 2010, pp. 19930-19940.

Clarkson, W. A. et al. "Two-Mirror Beam-Shaping Technique for High-Power Diode Bars" Optics Letters, vol. 21, No. 6, Mar. 15, 1996, pp. 375-377.

\* cited by examiner

SPECTRAL-TEMPORAL MULTIPLEXER FOR PULSED FIBER SCALING

CROSS-REFERENCE TO RELATED APPLICATIONS

This application claims the benefit of the filing date of Provisional Application Ser. No. 61/982,234 titled, Spectral-Temporal Multiplexer for Pulsed Fiber Scaling, filed Apr. 21, 2014.

BACKGROUND

1. Field

This invention relates generally to a pulsed fiber laser amplifier system and, more particularly, to a pulsed fiber laser amplifier system that employs a plurality of optical sources providing seed pulse beams at different wavelengths and a single fiber amplifier chain that amplifies all of the seed pulse beams at different time intervals, where the spaced apart amplified seed pulse beams are combined into a single pulse output beam using a spectral-temporal beam combiner.

2. Discussion

High power laser amplifiers have many applications, including industrial, commercial, military, etc. Designers of laser amplifiers are continuously investigating ways to increase the power of the laser amplifier for these applications. One known type of laser amplifier is a fiber laser amplifier that employs a doped fiber and a pump beam to generate the laser beam, where the fiber has an active core diameter of about 10-20 µm or larger.

Improvements in fiber laser amplifier designs have increased the output power of the fiber to approach its theoretical power and beam quality limit. To further increase the output power of a fiber amplifier some fiber laser systems employ multiple fiber lasers that combine the fiber beams in some fashion to generate higher powers. A design challenge for fiber laser amplifier systems of this type is to combine the beams from a plurality of fibers in a coherent manner so that the beams provide a single beam output having a uniform phase over the beam diameter such that the beam can be focused to a small focal spot. Focusing the combined beam to a small spot at a long distance (far-field) defines the beam quality of the beam, where the more the more uniform the combined phase front the better the beam quality.

In one known multiple fiber amplifier design, a master oscillator (MO) generates a signal beam that is split into a plurality of fiber beams each having a common wavelength where each fiber beam is amplified. The amplified fiber beams are then collimated and directed to a diffractive optical element (DOE) that combines the coherent fiber beams into a signal output beam. The DOE has a periodic structure formed into the element so that when the individual fiber beams each having a slightly different angular direction are redirected by the periodic structure all of the beams diffract from the DOE in the same direction. Each fiber beam is provided to a phase modulator that controls the phase of the beam so that the phase of all the fiber beams is maintained coherent. However, limitations on bandwidth and phasing errors limits the number of fiber beams that can be coherently combined, thus limiting the output power of the laser.

To overcome these limitations and further increase the laser power, multiple master oscillators are provided to generate signal beams at different wavelengths, where each of the individual wavelength signal beams are split into a number of fiber beams and where each group of fiber beams has the same wavelength and are mutually coherent. Each group of the coherent fiber beams at a respective wavelength are first coherently combined by a DOE, and then each group of coherently combined beams are directed to a spectral beam combination (SBC) grating at slightly different angles that diffracts the beams in the same direction as a single combined beam of multiple wavelengths. The SBC grating also includes a periodic structure for combining the beams at the different wavelengths.

One specific application for fiber laser amplifiers is for 3-D Ladar range finding of objects that may be at a considerable distance. Laser beam pulses emitted by the fiber laser amplifier are reflected off of the object being targeted, and the reflected pulses from the object are collected by a receiver that includes, for example, an avalanche diode charge coupled device (CCD) array that provides both temporal and spatial imaging of the object to provide range information. By employing pulse widths of about 1 ns, images of the object can be achieved with a spatial resolution of inches at a range of 100 kilometers or more, thus providing a usable system for both terrestrial and space applications.

For certain fiber laser range finder systems, the fiber amplifiers operate in the <200 kHz range, where the energy storage capability and hence the average power capability of the fiber is limited because of peak power limitations. Typical large core fibers, i.e., 40 µm, often employed for these applications can store energies of about 2.5 mJ/pulse, but are limited to about 250 µJ/pulse at 1 ns pulse width by nonlinearities, such as self-phase modulation, in the fiber, which broadens the beam spectrum beyond what is usable for many applications. Further, these applications often require electrically efficient compact laser sources in the 200 W average power range. Such amplifier systems require pulse energies of 5 mJ/pulse, 0.5-1 ns pulse widths, and are limited to repetition rates of less than 40 kHz by a single photon counter detector readout electronic rate and require laser spectral bandwidths less than 1 nm so that the receiver can discriminate against solar background effects.

The pulse energies referred to above for laser range finding applications cannot be achieved using a single fiber amplifier chain because of the material limitations of the fiber. In order to obtain the desired power for these applications a number of fiber amplifier chains operating at different wavelengths are typically employed, where the fiber beam from each fiber amplifier chain is combined by, for example, a spectral beam combiner to provide a single pulse overlapped output beam at the desired power level. However, providing many fiber chains to provide the desired power significantly increases the complexity of the system, the cost of the system and the ability to package the system in a reasonable manner.

DETAILED DESCRIPTION OF THE EMBODIMENTS

The following discussion of the embodiments of the invention directed to a pulsed fiber laser amplifier system is merely exemplary in nature, and is in no way intended to limit the invention or its applications or uses.

Figure 1:
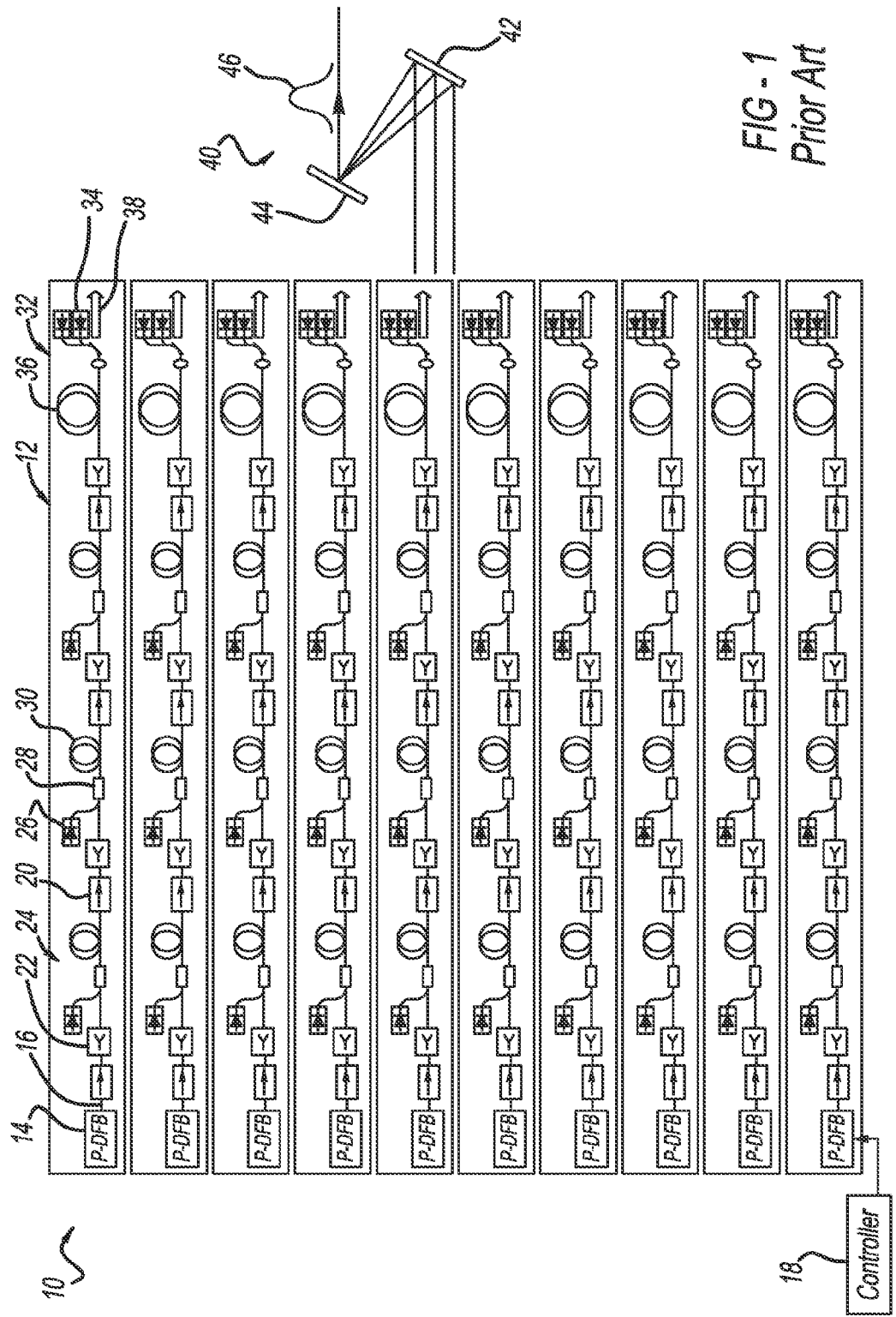
FIG. 1 is a schematic illustration of a known fiber laser amplifier system including a plurality of fiber laser amplifying chains.

FIG. 1 is a schematic illustration of a known pulsed fiber array laser amplifier system 10 including a plurality of fiber amplifier chains 12 each including a pulsed laser seed beam source 14, for example, a pulsed DFB diode, a laser, a solid-state laser, etc. producing a seed beam on a fiber 16 at different wavelengths $\lambda_1, \lambda_2, \ldots, \lambda_N$. The wavelength spacing between adjacent chains 12 can be any suitable wavelength difference for spectral beam combining as discussed herein. In this non-limiting example, the system 10 includes ten of the amplifier chains 12 as representative of a typical laser range finding system. A controller 18 controls each of the seed beam sources 14 so that they generate their pulses in synchronization, i.e., at the same time.

Each of the chains 12 also includes a plurality of strategically positioned Faraday isolators 20 that allow light to propagate only in the desired direction so as to prevent optical beams from entering components and potentially causing damage thereto, and a plurality of strategically positioned tap couplers 22 that allow a small portion of the seed beam at various stages of amplification in the chain 12 to be separated from the main seed beam for diagnostic purposes. Each of the fiber chains 12 also includes a plurality of amplification stages 24 each including an emitter pump diode 26 that generates a pump beam provided to a pump coupler 28 that amplifies the seed beam in a fiber amplifier 30 in a known manner. In an alternate embodiment, other types of optical amplifiers may be applicable. In one non-limiting example, the fiber amplifiers 30 are a polarization maintaining (PM), single mode (SM), ytterbium (Yb) doped length of fiber having a 10 μm core. A final fiber amplification stage 32 may, for example, provide more light amplification through multiple emitter pump diode arrays 34 and a 25/40 μm, SM, PM, Yb doped fiber amplifier 36 and counter-pumping. An amplified pulse beam 38 is then output from each of the amplifier chains 12 at the same time. The amplification of the pulsed beam at the various amplification stages 24 in each chain 12 is carefully controlled so that the peak power limitation of the fiber 16 is not exceeded.

Each amplified pulse beam 38 at the particular wavelength λ from the chains 12 is directed to a spectral beam combiner (SBC) 40 including a first grating 42 that directs each of the pulse beams 38 impinging the grating 42 from a different direction to be directed to a second grating 44 at the same location so all of the pulse beams 38 are combined as a single output beam pulse 46 at the desired power level and propagating in the same direction.

The present invention proposes reducing the number of components in a pulsed fiber laser amplification system of the type discussed above by employing a single fiber amplifier chain, where pulses at the different wavelengths from a plurality of different seed beam sources are amplified by the fiber chain at different points in time so that the power limitations of the fiber is not exceeded.

Figure 2:
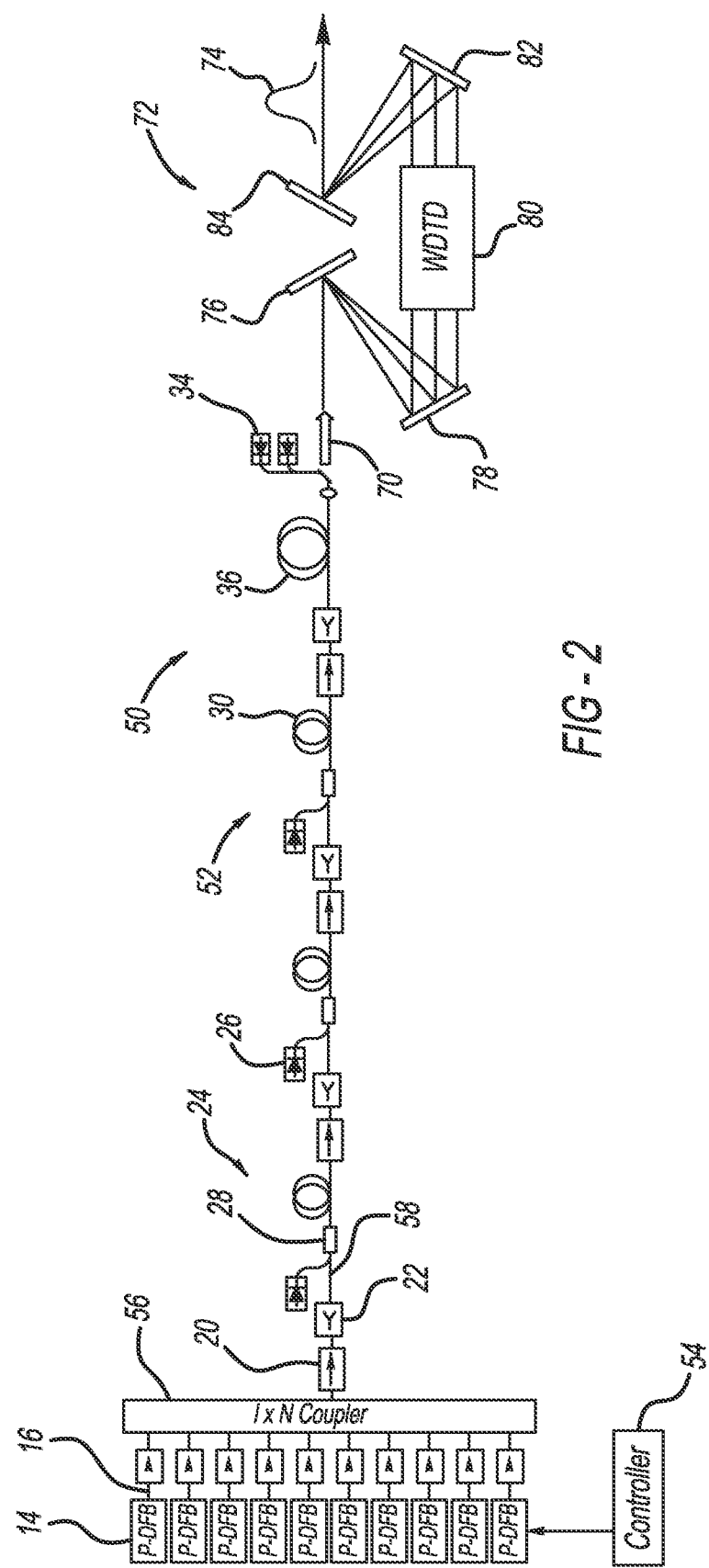
FIG. 2 is a schematic illustration of a fiber laser amplifier system including a plurality of optical seed sources, a single fiber amplifying chain and a spectral-temporal beam combiner.

FIG. 2 is a schematic illustration of a pulsed fiber amplifier system 50 of the type referred to above including a single fiber amplifier chain 52, where like elements to the system 10 are identified by the same reference number. In this non-limiting embodiment, the beam power output of the laser system 50 is the same as the beam power output of the laser system 10 by including the same number of the seed sources 14 each producing the same wavelength seed beam at the same pulse-width and the same number of the amplification stages 24 in the fiber chain 52. Instead of each of the seed sources 14 being synchronized to produce its pulses at the same time as in the system 10, the seed sources 14 in the system 50 are controlled by a controller 54 so that only a single one of the seed sources 14 is producing its pulsed seed beam at a particular point of time. The timing of the seed pulse beam is selected so that the temporal overlap of the seed pulse beams propagating through fiber chain 52 does not exceed the peak power limitations of the fiber 58, but where the pulses are close enough in time so that they can be temporally combined as will be discussed below.

Figure 3:
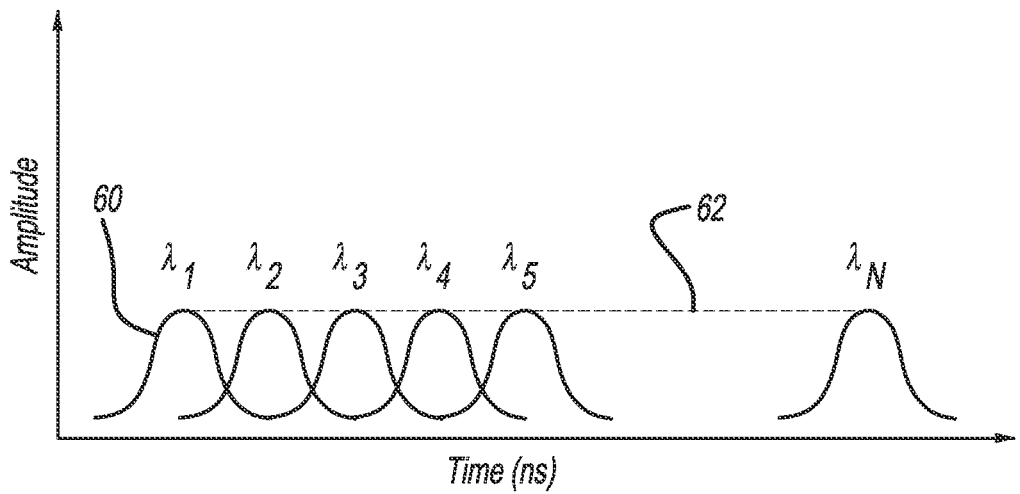
FIG. 3 is a graph with time on the horizontal axis and amplitude on the vertical axis showing a combined pulse envelope for multiple beam input pulses combined by a passive beam combiner.
Figure 4:
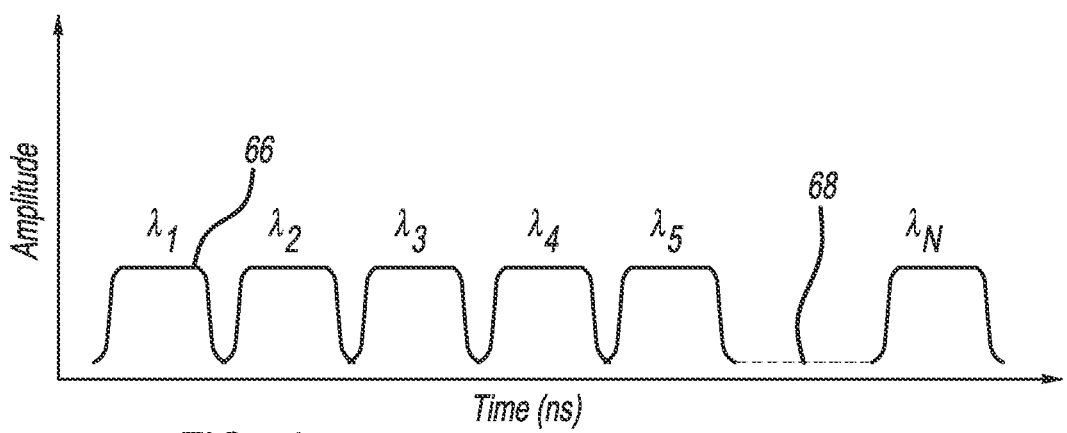
FIG. 4 is a graph with time on the horizontal axis and amplitude on the vertical axis showing a combined pulse envelope for multiple beam input pulses combined by an electro-optic beam combiner.

All of the pulsed seed beams from the seed sources 14 are provided to a 1×N coupler 56 that directs each seed pulse beam onto the fiber 58 for amplification in the same manner as each of the fiber chains 12 discussed above. In one embodiment, the coupler 56 is a passive combiner that passes the Gaussian distributed pulses unaffected. FIG. 3 is a graph with time on the horizontal axis and amplitude on the vertical axis showing a seed beam output from the coupler 56, where each of the seed pulse beams from the seed sources 14 are shown as Gaussian pulses 60, and where the combined pulses 60 define a combined pulse envelope 62. In an alternate embodiment, the coupler 56 is an electro-optic 1×N combiner that allows the pulse-shapes to be programmable. This embodiment is illustrated in FIG. 4 showing a graph with time on the horizontal axis and amplitude on the vertical axis, where the seed pulse beams from each of the seed beam sources 14 is shown as a square pulse 66 having a combined pulse envelope 68.

The combined pulse envelope put on the fiber 58 from the coupler 56 is amplified in the fiber chain 52 in the same manner as the separate pulses amplified in the fiber chains 12 to produce an amplified pulse envelope beam 70. The amplified pulse envelope beam 70 from the fiber chain 52 is then sent to a spectral-temporal beam combiner (STBC) 72 that causes the pulses in the envelope beam 70 to overlap both spectrally and temporally to produce an output pulse beam 74 having the power of all of the pulse beams combined. The STBC 72 includes a first SBC grating 76 that receives the beam 70 and directs each of the pulses in the beam 70 having the different wavelengths propagating in a slightly different direction to be received by a second SBC grating 78. The grating 78 redirects the separate pulse beams to a wavelength dependent temporal delay (WDTD) optics 80 that delays each of the separate pulse beams of the different wavelengths for a different period of time depending on when the pulse was generated so that all of the pulse beams are output from the WDTD optics 80 at the same time and in separate directions. The pulse beams from the optics 80 are directed to a third SBC grating 82 that redirects the beams so that they impinge a fourth SBC grating 84 at the same location to be output as the single pulse beam 74 having the desired power. Thus, the system 50 emits amplified laser beam pulses at high power and at predetermined intervals in the manner discussed herein.

The WDTD optics 80 can be any suitable optical system that provides the desired optical delay of each of the separate pulse beams and can employ any combination of one or more of mirrors, dispersive materials of different lengths, lenses, etc.

Figure 5:
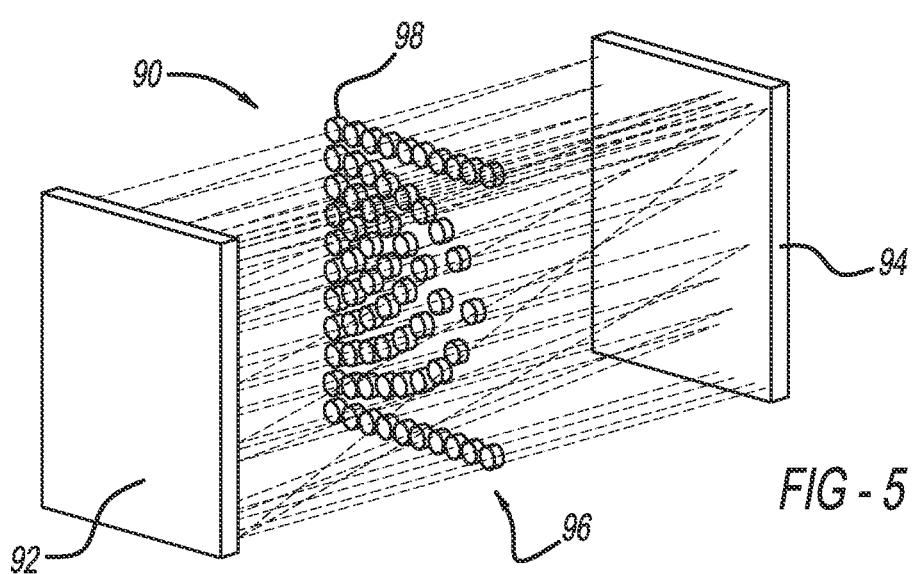
FIG. 5 is an isometric view of a wavelength dependent temporal delay (WDTD) optics employed in the spectral-temporal beam combiner in the amplifier system shown in FIG. 2.

FIG. 5 is an isometric view of a WDTD optics 90 providing a general illustration of the type of optics that can be employed for the optics 80 in the system 50. The optics 90 includes a mirror array 92 at one end of the optics 90, a mirror array 94 at an opposite end of the optics 90, and a lens array 96 including lenses 98 positioned therebetween. Each of the mirror arrays 92 and 94 would include a configuration of many mirror elements (not shown) oriented and configured together at different angles to reflect the pulse beams consistent with the discussion herein. Each of the pulse beams enter the optics 90 through the top or bottom of the mirror array 92 at a particular angular orientation depending on how the beam is reflected from the grating 78. That particular pulse beam will be focused by a particular one of the lenses 98 to be directed onto a particular mirror element in the mirror array 94 to be reflected back through another one of the lenses 98 and be reflected by a mirror element on the mirror array 92 to again be sent back through another one of the lenses 98 to the mirror array 94. The mirror elements and the lenses 98 are strategically positioned so that the number of reflections between the mirror arrays 92 and 94 for a particular pulse beam depends on its angular orientation and will provide the desired delay for that beam within the optics 90 so that when it is directed out of the optics 90 through the top or bottom of the mirror array 94 it is at the same time as all of the other pulsed beams entering the optics 90 at different times for the particular output pulse beam being generated. In one non-limiting embodiment, the mirror and lens arrays 92, 94 and 96 can be made as monolithic sub-blocks using chemically assisted precision optical bonding techniques, well known to those skilled in the art.

Figure 6:
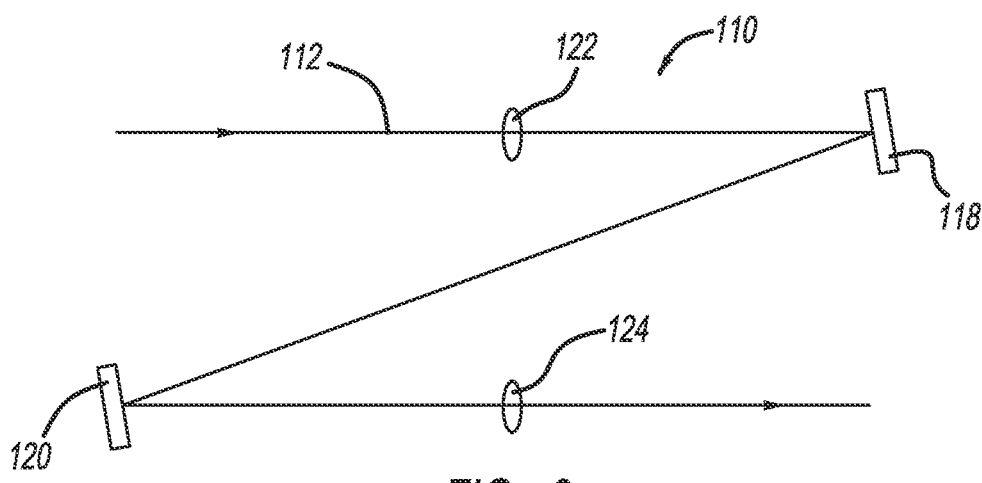
FIG. 6 is an illustration of a beam delay path for one of the amplified pulse beams in the WDTD optics.
Figure 7:
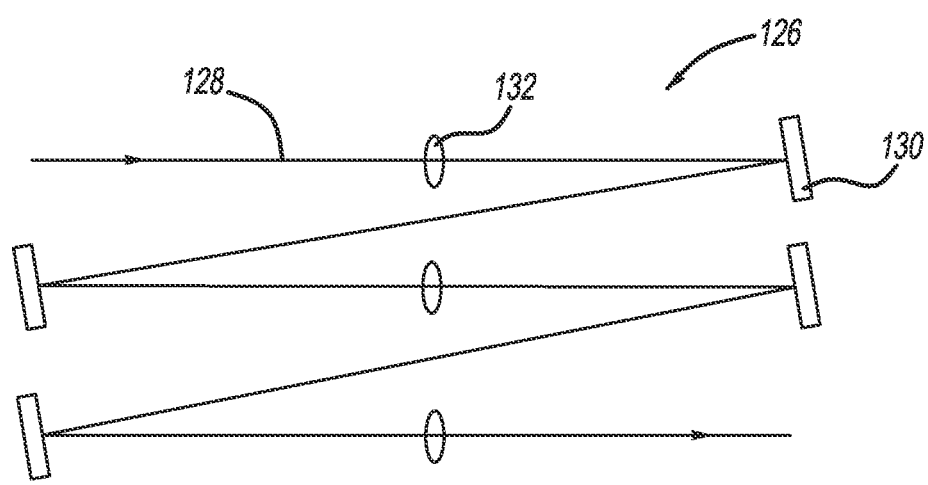
FIG. 7 is an illustration of another beam delay path for one of the amplified pulse beams in the WDTD optics.
Figure 8:
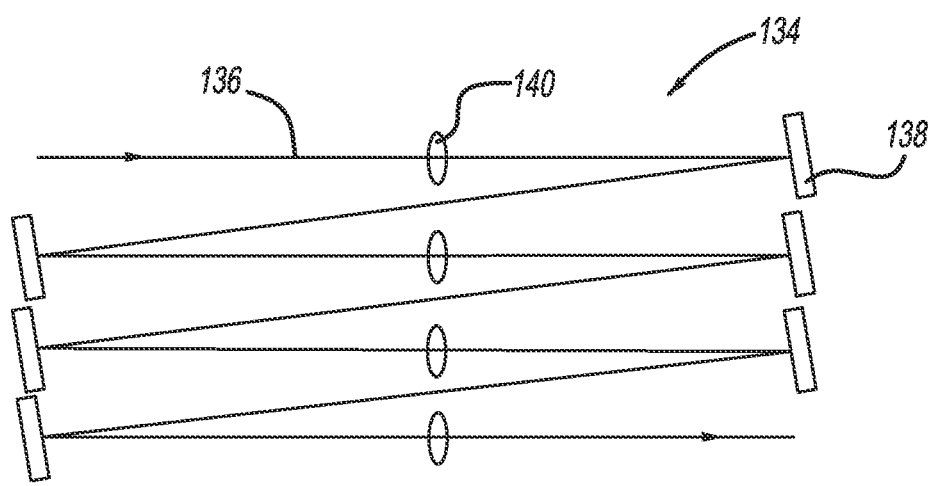
FIG. 8 is an illustration of another beam delay path for one of the amplified pulse beams in the WDTD optics.

FIGS. 6-8 illustrate three optical paths within the WDTD optics 90 to show the beam delay as just described. Particularly, FIG. 6 shows a delay optics 110 for a pulse beam 112 having one wavelength that is reflected off of two mirror elements 118 and 120 and is focused by two lenses 122 and 124 to provide three passes through the optics 90 and provide the shortest delay.

FIG. 7 shows a delay optics 126 for a pulse beam 128 having another wavelength that is reflected off of four mirror elements 130 and is focused by three lenses 132, as shown, to provide five passes through the optics 90 and give a longer delay than the delay optics 110.

FIG. 8 shows a delay optics 134 for a pulse beam 136 having another wavelength that is reflected off of six mirror elements 138 and is focused by four lenses 140, as shown, to provide seven passes through the optics 90 and provide a longer delay than the delay optics 126.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A pulsed fiber laser amplifier system comprising:
    a plurality of optical seed beam sources each generating a seed pulse beam at a different point in time than the other seed beam sources and at a different wavelength than the other seed beam sources;
    an optical coupler responsive to each of the seed pulse beams from each of the seed beam sources and outputting each of the seed pulse beams on a common optical path as spaced apart optical pulses defining a combined pulse envelope beam;
    at least one laser amplifier stage responsive to the pulse envelope beam from the coupler and amplifying each pulse beam in the pulse envelope beam; and
    a spectral-temporal beam combiner (STBC) responsive to the amplified pulse envelope beam and providing a separate delay for each of the amplified pulse beams in the pulse envelope beam so as to output a single output beam pulse that is an overlap of all of the individual amplified pulse beams in the pulse envelope beam, said STBC including a plurality of spectral beam combining (SBC) gratings and wavelength dependent temporal delay (WDTD) optics, wherein the plurality of SBC gratings redirect the individual pulse beams in the pulse envelope beam along different propagation paths and the WDTD optics delays each pulse beam so that the optical pulse beams overlap in time, said WDTD optics including opposing mirror arrays each including a plurality of separate mirror elements configured at different angles relative to each other so as to reflect the pulse beams in different directions and a lens array including a plurality of lenses positioned therebetween.

2. The system according to claim 1 wherein the plurality of separate mirror elements direct each of the pulse beams through a different number of lenses.

3. The system according to claim 1 wherein the plurality of SBC gratings is four gratings where a first grating receives the pulse envelope beam from the at least one fiber amplifier and directs the pulse beams in the pulse envelope beam in different directions, a second grating redirects each of the pulse beams from the first grating into the WDTD optics, a third grating receives the delayed pulse beams from the WDTD optics and directs the pulse beams to a common point on a fourth grating that overlaps the pulse beams in space to generate the output beam pulse.

4. The system according to claim 1 wherein the WDTD optics includes monolithic sub-blocks formed by chemically assisted precision optical bonding.

5. The system according to claim 1 wherein the optical coupler is a passive coupler that outputs each seed pulse beam as a Gaussian distributed pulse.

6. The system according to claim 1 wherein the optical coupler is an electro-optic combiner that allows the pulse shapes to be programmable.

7. The system according to claim 1 wherein the at least one laser amplifier stage is at least one fiber amplifier stage.

8. The system according to claim 7 wherein the at least one fiber amplifier stage is a plurality of fiber amplifier stages in a fiber amplifier chain.

9. The system according to claim 1 wherein the pulse beams have a pulse width of about 1 nanosecond.

10. The system according to claim 1 wherein each amplified pulse beam has a pulse energy of about 2.5 mJ.

11. The system according to claim 1 wherein the optical seed beam sources are selected from the group consisting of diodes, fibers and solid-state lasers.

12. The system according to claim 1 wherein the system is a laser range finding system.

13. A pulsed fiber laser amplifier system comprising:
    a plurality of optical seed beam sources each generating a seed pulse beam at a different point in time than the other seed beam sources and at different wavelength than the other seed beam sources, wherein the seed pulse beams have a pulse width of about 1 nanosecond;

an optical coupler responsive to each of the seed pulse beams from each of the seed beam sources and outputting each of the seed pulse beams on a common optical path as spaced apart optical pulses defining a combined pulse envelope beam;

a fiber amplifier chain including a plurality of fiber amplifier stages responsive to the pulse envelope beam from the coupler and amplifying each pulse in the pulse envelope beam; and a spectral-temporal beam combiner (STBC) responsive to the amplified pulse envelope beam and providing a separate delay for each of the amplified pulse beams in the pulse envelope beam so as to output a single output beam pulse that is an overlap of all of the individual amplified pulse beams in the pulse envelope beam, said STBC including a plurality of spectral beam combining (SBC) gratings and wavelength dependent temporal delay (WDTD) optics, wherein the plurality of SBC gratings redirect the individual pulse beams in the pulse envelope beam along different propagation paths and the WDTD optics delays each pulse beam so that the optical pulse beams overlap in time, said WDTD optics including opposing mirror arrays each including a plurality of separate mirror elements configured at different angles relative to each other so as to reflect the pulse beams in different directions and a lens array including a plurality of lenses positioned therebetween.

14. The system according to claim 13 wherein the plurality of SBC gratings is four gratings where a first grating receives the pulse envelope beam from the fiber amplifier chain and directs the pulses in the pulse envelope beam in different directions, a second grating redirects each of the pulse beams from the first grating into the WDTD optics, a third grating receives the delayed pulse beams from the WDTD optics and directs the pulse beams to a common point on a fourth grating that overlaps the pulse beams in space to generate the output beam pulse.

15. The system according to claim 13 wherein the plurality of separate mirror elements direct each of the pulse beams through a different number of lenses.

16. The system according to claim 13 wherein the optical coupler is selected from the group consisting of a passive coupler that outputs each seed pulse beam as a Gaussian distributed pulse and an electro-optic combiner that allows the pulse shapes to be programmable.

17. A spectral-temporal beam combiner (STBC) responsive to a pulse envelope beam including a plurality of spaced apart optical pulses, said STBC comprising:

a plurality of spectral beam combining (SBC) gratings that redirect the individual pulses in the pulse envelope beam along different propagation paths; and wavelength dependent temporal delay (WDTD) optics that receives the pulses in the pulse envelope beam and delays each pulse so that the pulses exit the WDTD optics at the same time, said WDTD optics including opposing mirror arrays each including a plurality of separate mirror elements configured at different angles relative to each other so as to reflect the pulses in different directions and a lens array including a plurality of lenses positioned therebetween, wherein one or more of the SBC gratings receive the pulses from the WDTD optics and overlap the pulses in space to output a single pulse output beam.

18. The STBC according to claim 17 wherein the plurality of SBC gratings is four gratings where a first grating receives the pulse envelope beam and directs the pulses in the pulse envelope beam in different directions, a second grating redirects each of the pulses from the first grating into the WDTD optics, a third grating receives the delayed pulses from the WDTD optics and directs the pulses to a common point on a fourth grating that overlaps the pulses to generate the output beam pulse.

19. The STBC according to claim 17 wherein the WDTD optics includes opposing mirror arrays each including a plurality of mirror elements and a lens array including a plurality of lenses positioned therebetween.

\* \* \* \* \*